(12) United States Patent
Iwashita et al.

(10) Patent No.: US 12,435,426 B2
(45) Date of Patent: Oct. 7, 2025

(54) SUBSTRATE LIQUID PROCESSING APPARATUS AND SUBSTRATE LIQUID PROCESSING METHOD

(71) Applicant: Tokyo Electron Limited, Tokyo (JP)

(72) Inventors: Mitsuaki Iwashita, Nirasaki (JP); Takeshi Nagao, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/754,573

(22) PCT Filed: Sep. 28, 2020

(86) PCT No.: PCT/JP2020/036604
§ 371 (c)(1),
(2) Date: Apr. 6, 2022

(87) PCT Pub. No.: WO2021/070659
PCT Pub. Date: Apr. 15, 2021

(65) Prior Publication Data
US 2024/0060186 A1    Feb. 22, 2024

(30) Foreign Application Priority Data
Oct. 9, 2019    (JP) .................. 2019-186239

(51) Int. Cl.
*C23C 18/16*    (2006.01)
(52) U.S. Cl.
CPC ...... *C23C 18/1628* (2013.01); *C23C 18/1619* (2013.01); *C23C 18/1633* (2013.01); *C23C 18/1676* (2013.01); *C23C 18/168* (2013.01)

(58) Field of Classification Search
None
See application file for complete search history.

(56) References Cited

U.S. PATENT DOCUMENTS

| | | | | |
|---|---|---|---|---|
| 5,865,894 A | * | 2/1999 | Reynolds | C23C 18/1666 118/603 |
| 2004/0194698 A1 | * | 10/2004 | Hongo | H01L 21/288 257/E21.174 |
| 2005/0016201 A1 | * | 1/2005 | Ivanov | C23C 18/1676 62/185 |

FOREIGN PATENT DOCUMENTS

| | | | | |
|---|---|---|---|---|
| JP | 2003129251 A | * | 5/2003 | ......... C23C 18/1617 |
| JP | 2005-060792 A | | 3/2005 | |

(Continued)

OTHER PUBLICATIONS

International Search Report for PCT/JP2020/036604 dated Nov. 10, 2020.

*Primary Examiner* — Charles Capozzi
(74) *Attorney, Agent, or Firm* — Chrisman Gallo Tochtrop LLC (57) ABSTRACT

A technique advantageous for shortening time required for electroless plating that is performed on a substrate is provided. A substrate liquid processing apparatus includes a substrate holder configured to hold the substrate; a reaction acceleration unit, configured to accelerate a plating reaction of an unused electroless plating solution, including an activation unit configured to accelerate the electroless plating solution with respect to the plating reaction and a reaction heater configured to heat the electroless plating solution; and a plating solution supply configured to supply the electroless plating solution to the substrate held by the substrate holder.

11 Claims, 6 Drawing Sheets

(56) References Cited

FOREIGN PATENT DOCUMENTS

| JP | 2007-525595 A | 9/2007 |
|----|---------------|--------|
| JP | 2011-001633 A | 1/2011 |
| JP | 2013-010996 A | 1/2013 |
| JP | 2013-112846 A | 6/2013 |
| KR | 10-2019-0103136 A | 9/2019 |

\* cited by examiner

SUBSTRATE LIQUID PROCESSING APPARATUS AND SUBSTRATE LIQUID PROCESSING METHOD

CROSS-REFERENCE TO RELATED APPLICATIONS

This Application is a U.S. national phase application under 35 U.S.C. § 371 of PCT Application No. PCT/JP2020/036604 filed on Sep. 28, 2020, which claims the benefit of Japanese Patent Application No. 2019-186239 filed on Oct. 9, 2019, the entire disclosures of which are incorporated herein by reference.

TECHNICAL FIELD

The various aspects and exemplary embodiments described herein pertain generally to a substrate liquid processing apparatus and a substrate liquid processing method.

BACKGROUND

Electroless plating is widely used as a method for forming a wiring on a substrate such as a semiconductor wafer, and various techniques for shortening a processing time have been introduced.

For example, Patent Document 1 discloses a technique that makes it possible to shorten a plating time by improving a reaction rate of an electroless plating solution.

PRIOR ART DOCUMENT

Patent Document 1: Japanese Patent Laid-open Publication No. 2013-010996

DISCLOSURE OF THE INVENTION

Problems to be Solved by the Invention

In view of the foregoing, the present disclosure provides a technique that is beneficial for shortening time required for electroless plating that is performed on a substrate.

Means for Solving the Problems

In one exemplary embodiment, a substrate liquid processing apparatus includes a substrate holder configured to hold a substrate; a reaction acceleration unit, configured to accelerate a plating reaction of an unused electroless plating solution, including an activation unit configured to accelerate the electroless plating solution with respect to the plating reaction and a reaction heater configured to heat the electroless plating solution; and a plating solution supply configured to supply the electroless plating solution to the substrate held by the substrate holder.

Effects of the Invention

According to the present disclosure, it is advantageous for shortening the time required for the electroless plating that is performed on the substrate.

DETAILED DESCRIPTION

Hereinafter, a substrate liquid processing apparatus and a substrate liquid processing method will be described with reference to the accompanying drawings.

Figure 1:
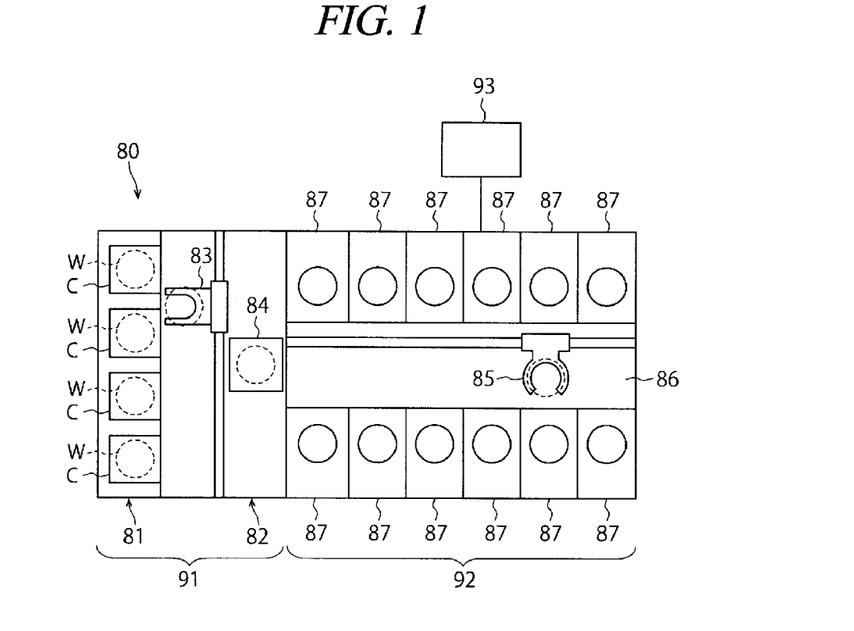
FIG. 1 is a schematic diagram showing a plating apparatus as an example of a substrate liquid processing apparatus.

FIG. 1 is a schematic diagram showing a plating apparatus 80 as an example of a substrate liquid processing apparatus.

The plating apparatus 80 shown in FIG. 1 includes a carry-in/out station 91, and a processing station 92. The carry-in/out station 91 includes a placing unit 81 equipped with a plurality of carriers C, and a transfer unit 82 equipped with a first transfer mechanism 83 and a delivery unit 84. A plurality of substrates W is horizontally accommodated in each carrier C. The processing station 92 is equipped with a plurality processing units 87 provided on both sides of a transfer path 86, and a second transfer mechanism 85 configured to move along the transfer path 86.

A substrate W is taken out of a carrier C and then loaded into the delivery unit 84 by the first transfer mechanism 83, and then taken out of the delivery unit 84 by the second transfer mechanism 85. The substrate W is carried into a corresponding processing unit 87 by the second transfer mechanism 85, and electroless plating is performed on the substrate W in the corresponding processing unit 87. Thereafter, the substrate W is taken out of the corresponding processing unit 87 by the second transfer mechanism 85.

The substrate W taken out of the corresponding processing unit 87 is transferred into the delivery unit 84 by the second transfer mechanism 85 and then returned back to the carrier C of the placing unit 81 from the delivery unit 84 by the first transfer mechanism 83.

Figure 2:
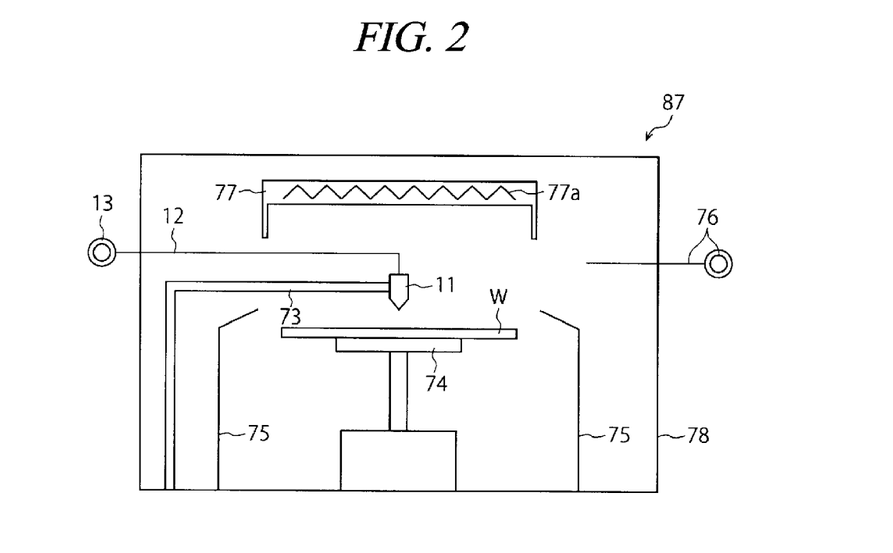
FIG. 2 is a diagram schematically showing an example of a processing unit.

In the present example, each processing unit 87 of the processing station 92 is configured as a plating unit to be illustrated in FIG. 2. However, all the processing units 87 are not necessarily configured as the plating units shown in FIG. 2. For example, only some of the processing units 87 may be configured as the plating units shown in FIG. 2 to perform the electroless plating, and the other processing units 87 may be configured to perform processings other than the electroless plating. Alternatively, the processing station 92 may be equipped with only a single processing unit 87.

The plating apparatus 80 includes a control device 93. The control device 93 is implemented by, for example, a computer, and includes a controller and a storage unit. The storage unit of the control device 93 stores therein a program and data for various processings performed by the plating apparatus 80. The controller of the control device 93 controls various devices of the plating apparatus 80 and performs various processings by appropriately reading and executing the program stored in the storage unit. Therefore, the electroless plating to be described later is also performed by driving various devices under the control of the control device 93.

The program and data stored in the storage unit of the control device 93 may be recorded in a computer-readable recording medium, or may be installed from the recording medium. Examples of the computer-readable recording medium may include a hard disc (HD), a flexible disc (FD), a compact disc (CD), a magnet optical disc (MO), and a memory card.

FIG. 2 is a diagram schematically showing an example of the processing unit 87. In FIG. 2, each component is illustrated in a simplified manner.

The processing unit 87 includes a processing liquid supply 11 provided to be movable by a discharge driving unit 73, a substrate holder 74, a cup structure 75, an inert gas supply 76, and a cover body 77 equipped with a heater 77a. The processing liquid supply 11, the discharge driving unit 73, the substrate holder 74, the cup structure 75 and the cover body 77 are provided inside a processing chamber 78.

The substrate holder 74 is configured to hold the substrate W so as to be rotatable. The substrate holder 74 has an arbitrary configuration. The substrate holder 74 holds and attracts a rear surface of the substrate W, but a method of holding the substrate W by the substrate holder 74 is not specifically limited.

The processing liquid supply 11 serves as a plating solution supply having at least a nozzle (not shown) configured to discharge an electroless plating solution. The processing liquid supply 11 is connected to a plating solution source 13 via a plating solution supply passage 12 and supplied with the electroless plating solution from the plating solution source 13 via the plating solution supply passage 12. FIG. 2 illustrates a simplified structure ranging from the plating solution source 13 to the processing liquid supply 11 via the plating solution supply passage 12, and specific examples of the structure will be described later (see FIG. 4 to FIG. 13).

The electroless plating solution that can be used in the present exemplary embodiment is not limited, and an autocatalytic type (reduction type) electroless plating solution may be typically used. The electroless plating solution contains, for example, metal ions, such as cobalt (Co) ions, nickel (Ni) ions, tungsten (W) ions, copper (Cu) ions, palladium (Pd) ions and gold (Au) ions, and reducing agents, such as hypophosphorous acid, dimethylamine borane, hydrazine and formalin. The electroless plating solution may also contain additives and the like. Examples of a plating film (metal film) formed by plating using the electroless plating solution may include Cu, Au, Pt, Ru, Pd, CoWB, CoB, CoWP, CoWBP, NiWB, NiB, NiWP, NiWBP and the like.

The processing liquid supply 11 may also be configured to supply another fluid. The processing liquid supply 11 also serves as a cleaning solution supply and a rinsing solution supply. That is, the processing liquid supply 11 further has a nozzle connected to a cleaning solution reservoir (not shown) that stores therein a cleaning solution for cleaning the substrate W, and a nozzle connected to a rinsing solution reservoir (not shown) that stores therein a rinsing solution for washing the substrate W. The cleaning solution may be, for example, an organic acid, such as formic acid, malic acid, succinic acid, citric acid or malonic acid, or dilute hydrofluoric acid (DHF) (hydrofluoric acid aqueous solution) diluted to a concentration at which a plating target surface of the substrate W is not corroded. The rinsing solution may be, for example, pure water.

The cup structure 75 receives a liquid scattered from the substrate W to guide the liquid to a drain unit (not shown), or rectifies a flow of a gas around the substrate W to suppress diffusion of the gas. A configuration of the cup structure 75 is not specifically limited. The cup structure 75 typically has a ring shape when viewed from the top and is provided to surround the substrate W held by the substrate holder 74. For example, the cup structure 75 may have a cup for mainly guiding the liquid and a cup for mainly rectifying the flow of the gas separately.

The inert gas supply 76 is configured to supply an inert gas (e.g., nitrogen) into the processing chamber 78. A discharge opening of the inert gas supply 76 is illustrated as a separate body from the cover body 77, but may also be provided as one body with the cover body 77.

The cover body 77 is provided to be movable up and down by a non-illustrated driving mechanism. While the processing liquid supply 11 is located above the substrate W, the cover body 77 is placed at a height position where the cover body 77 does not contact or collide with the processing liquid supply 11 and the discharge driving unit 73. When the electroless plating solution on the substrate W is heated, the processing liquid supply 11 is driven by the discharge driving unit 73 to be retreated from above the substrate W, and the cover body 77 comes closer to the substrate W so as to cover the electroless plating solution on the substrate W. Thus, heat generated from the heater 77a is transmitted to the electroless plating solution.

A method of heating the electroless plating solution using the cover body 77 is not limited. For example, if the electroless plating solution having a temperature lower than a temperature (hereinafter, referred to as "plating temperature") at which the plating metal is precipitated is supplied on the substrate W, the cover body 77 (the heater 77a) may heat the electroless plating solution on the substrate W to a desired plating temperature. Even if the electroless plating solution on the substrate W already has the plating temperature, the cover body 77 (the heater 77a) may suppress a decrease in temperature of the electroless plating solution or heat the electroless plating solution to a higher plating temperature.

The processing unit 87 may further include non-illustrated components. For example, the processing unit 87 may be equipped with a fan filter unit (FFU) configured to supply clean air (gas) into the processing chamber 78 and an exhaust pipe configured to exhaust the air in the processing chamber 78.

The substrate W is carried into the processing chamber 78 of the corresponding processing unit 87 and held by the substrate holder 74 in order to undergo the electroless plating. Then, a processing surface (top surface) of the substrate W held by the substrate holder 74 is sequentially subjected to cleaning and rinsing processings. That is, the cleaning solution is discharged from the nozzle provided in the processing liquid supply 11 toward the processing surface of the substrate W to clean the processing surface. Thereafter, the rinsing solution is discharged from the nozzle provided in the processing liquid supply 11 toward the processing surface of the substrate W to wash off the cleaning solution from the processing surface. In each of these cleaning and rinsing processings, the substrate holder 74 may rotate the substrate W with the cleaning solution or the rinsing solution remaining on the processing surface, if necessary.

Subsequently, the processing liquid supply 11 supplies the electroless plating solution to the processing surface of the substrate W held by the substrate holder 74, so that the plating metal is deposited on the processing surface. That is, while the substrate W is held by the substrate holder 74, the electroless plating solution is discharged from the processing liquid supply 11 toward the processing surface of the substrate W. Then, a state where the electroless plating solution is supplied to the entire processing surface of the substrate W is maintained, and the plating metal (e.g., copper) is selectively deposited and grown. As a result, a wiring made of the plating metal can be formed at a desired position on the processing surface of the substrate W. Also, the substrate holder 74 may rotate the substrate W with the electroless plating solution remaining on the processing surface.

The processing surface of the substrate W on which the plating metal is deposited to a desired film thickness is sequentially subjected to rinsing and drying processings in the processing unit 87, and then is taken out of the processing unit 87 and returned back to the corresponding carrier C (see FIG. 1). As described above, the rinsing processing is performed by supplying the rinsing solution from the processing liquid supply 11 to the processing surface of the substrate W. The drying processing is performed by rotating the substrate W by the substrate holder 74. Also, the inert gas may be discharged from the inert gas supply 76 onto the processing surface of the substrate W to accelerate the drying processing on the processing surface of the substrate W.

[Mechanism of Electroless Plating]

Figure 3:
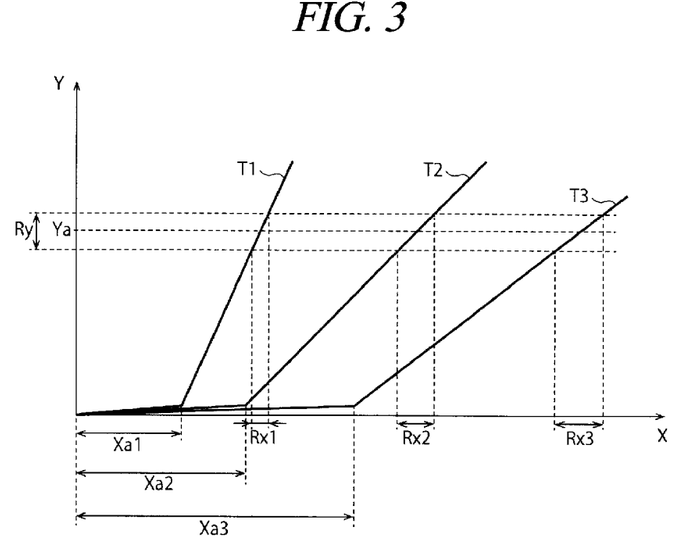
FIG. 3 is a graph for explaining a mechanism of electroless plating, and a horizontal axis represents time and a vertical axis represents a plating film thickness.

FIG. 3 is a graph for explaining a mechanism of the electroless plating, and the horizontal axis represents time X and the vertical axis represents a plating film thickness Y.

FIG. 3 schematically shows "examples of the relationship between the time X and the plating film thickness Y" for each of a first temperature electroless plating solution T1, a second temperature electroless plating solution T2 and a third temperature electroless plating solution T3. These electroless plating solutions satisfy a relationship of "temperature of the first temperature electroless plating solution T1>temperature of the second temperature electroless plating solution T2>temperature of the third temperature electroless plating solution T3".

In general, the electroless plating includes an incubation process and a plating film growing process after the incubation process. The incubation process is a process of forming an initial film of the plating metal on the processing surface of the substrate W. In the incubation process, a growth rate of the plating film thickness per unit time is relatively low. The plating film thickness Y of the initial film of the plating metal formed in the incubation process is very small, for example, several nm (nanometers) or less. The plating film growing process is a process of allowing a plating reaction to progress on the initial film of the plating metal formed in the incubation process. In the plating film growing process, a growth rate of the plating film thickness per unit time is relatively high. In the plating film growing process, the plating metal is deposited to a sufficient film thickness on the processing surface of the substrate W. For example, the plating metal having the plating film thickness Y of about several nm to 1 μm (micrometer) is formed on the processing surface.

The degree of progress of the electroless plating in the incubation process and the plating film growing process varies depending on the activity of the electroless plating solution with respect to the plating reaction. Specifically, as the activity of the electroless plating solution with respect to the plating reaction increases, the time required for the incubation process decreases and the deposition rate of the plating metal in the plating film growing process increases.

In general, the activity of the electroless plating solution with respect to the plating reaction increases as the temperature of the electroless plating solution increases and also increases as the contact time of the electroless plating solution with a catalyst member increases. Therefore, in the example shown in FIG. 3, a relationship of "activity of the first temperature electroless plating solution T1>activity of the second temperature electroless plating solution T2>activity of the third temperature electroless plating solution T3" is established. Therefore, a relationship of "incubation time Xa1 of the first temperature electroless plating solution T1<incubation time Xa2 of the second temperature electroless plating solution T2<incubation time Xa3 of the third temperature electroless plating solution T3" is established. Further, as for "an inclination of the plating film thickness Y with respect to the time X in the plating film growing process", the first temperature electroless plating solution T1 has a greater inclination than the second temperature electroless plating solution T2, and the third temperature electroless plating solution T3 has a smaller inclination than the second temperature electroless plating solution T2. Therefore, as for a period of time from when the plating film growing process starts to when the film thickness of the plating metal on the substrate W reaches a target plating film thickness Ya, the first temperature electroless plating solution T1 requires a shorter period of time than the second temperature electroless plating solution T2, and the third temperature electroless plating solution T3 requires a longer period of time than the second temperature electroless plating solution T2.

As described above, if the activity of the electroless plating solution with respect to the plating reaction is increased, the incubation time can be shortened, but the inclination of the plating film thickness Y with respect to the time X in the plating film growing process is increased. Typically, there is an allowable plating film thickness range Ry based on the target plating film thickness Ya. The electroless plating needs to be ended in a time range (hereinafter, referred to as "allowable plating end time range") in which the film thickness of the plating metal on the substrate W is within the allowable plating film thickness range Ry. As the allowable plating end time range becomes narrower, a control of ending the electroless plating becomes stricter, and, thus, the film thickness of the plating metal becomes non-uniform more easily. As is clear from the allowable plating end time ranges Rx1, Rx2 and Rx3 shown in FIG. 3, as the inclination of the plating film thickness Y with respect to the time X in the plating film growing process increases (that is, the activity of the electroless plating solution increases), the allowable plating end time range becomes narrower. Therefore, from the viewpoint of improving the quality, such as the film thickness uniformity, of the plating metal deposited on the substrate W, it is not preferable to excessively increase the inclination of the plating film thickness Y with respect to the time X in the plating film growing process (i.e., excessively increase the plating film growth rate). Further, when the plating film growth rate is high, abnormal growth of the plating metal or precipitation in solution is more likely to occur.

From the viewpoint of shortening the plating time by shortening the incubation time, it is preferable to increase the activity of the electroless plating solution with respect to the plating reaction. However, from the viewpoint of improving the quality of the plating metal, it is not preferable to excessively increase the plating film growth rate in the plating film growing process by increasing the activity of the electroless plating solution with respect to the plating reaction.

The present inventor studied the foregoing problems and have found a technique capable of shortening the incubation time without excessively increasing the plating film growth rate in the plating film growing process. That is, as a process of accelerating a plating reaction of an unused electroless plating solution, it is effective to separately perform a process of activating the electroless plating solution with respect to the plating reaction and a process of heating the electroless plating solution to the desired plating temperature.

The "unused electroless plating solution" is an electroless plating solution that never has been used before for the electroless plating and never has been activated to accelerate the plating reaction. Therefore, an electroless plating solution that never has been heated to a temperature higher than room temperature (normal temperature) (e.g., a temperature higher than 40° C.) and never has been in contact with a catalyst that activates the plating reaction is referred to as the unused electroless plating solution. Meanwhile, an electroless plating solution that has been used for the electroless plating and recovered is not referred to as the unused electroless plating solution. By using the unused electroless plating solution, it is possible to effectively avoid generation of particles in the electroless plating solution caused by an unintended progress of the electroless plating.

The process of activating the electroless plating solution with respect to the plating reaction (hereinafter, also referred to as "activation process") is performed for shortening the incubation time as one of the main purposes. Therefore, in the activation process, it is preferable to activate the electroless plating solution to the extent that the incubation process does not shift to the plating film growing process. Meanwhile, the process of heating the electroless plating solution to the precipitation temperature of the plating metal (hereinafter, also referred to as "reaction heating process") is performed for controlling the plating film growth rate in the plating film growing process as one of the main purposes. Therefore, in the reaction heating process, it is preferable to heat the electroless plating solution to a temperature at which the plating film thickness Y has a desired inclination with respect to the time X in the plating film growing process.

The above-described activation process and reaction heating process can be performed in various ways. Hereinafter, typical exemplary embodiments will be described.

First Exemplary Embodiment

Figure 4:
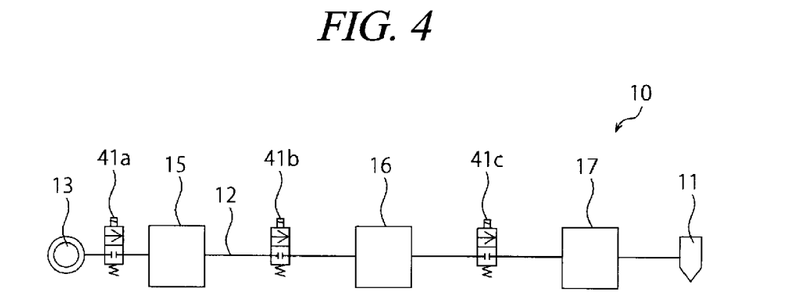
FIG. 4 is a schematic diagram illustrating a structural example of a reaction acceleration unit according to a first exemplary embodiment.

FIG. 4 is a schematic diagram illustrating a structural example of a reaction acceleration unit 10 according to a first exemplary embodiment. The reaction acceleration unit 10 configured to accelerate a plating reaction of an unused electroless plating solution includes an activation unit 15 and a reaction heater 17.

In the present exemplary embodiment, the activation unit 15, a reservoir 16 and the reaction heater 17 are provided sequentially from an upstream side toward a downstream side of the plating solution supply passage 12 connecting the plating solution source 13 and the processing liquid supply 11. The activation unit 15 is provided via an electromagnetic on-off valve 41a on a downstream side of the plating solution source 13. The reservoir 16 is provided via an electromagnetic on-off valve 41b on a downstream side of the activation unit 15. The reaction heater 17 is provided via an electromagnetic on-off valve 41c on a downstream side of the reservoir 16. The processing liquid supply 11 is provided without any electromagnetic on-off valve on a downstream side of the reaction heater 17. The electromagnetic on-off valves 41a, 41b and 41c open and close the plating solution supply passage 12 under the control of the control device 93 and regulate the flow of the electroless plating solution in the plating solution supply passage 12.

The plating solution source 13 is configured to send an unused electroless plating solution to the plating solution supply passage 12. The electroless plating solution sent from the plating solution source 13 may or may not contain additives such as a pH regulator. The additives such as a pH regulator may be added into the electroless plating solution after the electroless plating solution is sent from the plating solution source 13. For example, the additives such as a pH regulator may be added into the electroless plating solution stored in the reservoir 16.

The activation unit 15 is configured to activate the electroless plating solution sent from the plating solution source 13 with respect to the plating reaction by an arbitrary method. Typically, the activation unit 15 may activate the electroless plating solution by heating the electroless plating solution or by bringing the electroless plating solution into contact with a catalyst member. Specific configuration examples of the activation unit 15 will be described later (see FIG. 5 and FIG. 6).

The electroless plating solution activated by the activation unit 15 is stored in the reservoir 16. The electroless plating solution stored in the reservoir 16 is placed in a low temperature environment effective for suppressing the precipitation of the plating metal in the reservoir 16. For example, the temperature may be controlled to room temperature (normal temperature) or less. The electroless plating solution stored in the reservoir 16 may be left in a room temperature environment, or the temperature of the electroless plating solution may be lowered actively by a chiller (not shown). As such, by controlling the temperature of the activated electroless plating solution to room temperature or less in the reservoir 16, the activated electroless plating solution can be stabilized, and the stabilized electroless plating solution can be sent to the reaction heater 17 disposed on a downstream side.

The reaction heater 17 is configured to heat the electroless plating solution which has been activated by the activation unit 15 and sent from the reservoir 16. The reaction heater 17 heats the electroless plating solution flowing in the plating solution supply passage 12 directly connected to the processing liquid supply 11. The electroless plating solution is heated by the reaction heater 17 to a temperature for precipitating the plating metal and then immediately sent to the processing liquid supply 11 without being stopped by an electromagnetic on-off valve or the like.

The processing liquid supply 11 supplies the substrate W with the electroless plating solution which has been activated by the activation unit 15 and heated by the reaction heater 17 to the desired plating temperature.

Hereinafter, a typical example of the activation unit 15 will be described.

Figure 5:
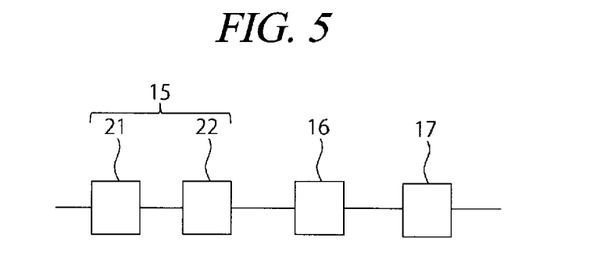
FIG. 5 is a schematic diagram showing an example of an activation unit according to the first exemplary embodiment.

FIG. 5 is a schematic diagram showing an example of the activation unit 15 according to the first exemplary embodiment. In FIG. 5, illustration of the electromagnetic on-off valves (see reference numerals "41*a*", "41*b*" and "41*c*" in FIG. 4) is omitted.

The activation unit 15 shown in FIG. 5 has an activation heater 21 provided on an upstream side and a temperature lowering unit 22 provided on a downstream side. The activation heater 21 can be configured as a heater or the like and heats the electroless plating solution. The temperature lowering unit 22 can be configured as a chiller or the like and lowers the temperature of the electroless plating solution heated by the activation heater 21. Preferably, the activation heater 21 and the temperature lowering unit 22 may adjust the temperature of the electroless plating solution to the extent that the plating metal is not precipitated in the electroless plating solution.

The electroless plating solution which has been heated by the activation heater 21 and cooled by the temperature lowering unit 22 is stored in the reservoir 16 in a state where the activation with respect to the plating reaction has progressed. Then, the electroless plating solution is heated by the reaction heater 17 to the desired plating temperature. The heating temperature of the electroless plating solution by the activation heater 21 is not specifically limited. For example, the activation heater 21 may heat the electroless plating solution to a temperature equal to the heating temperature (i.e., the desired plating temperature) of the electroless plating solution by the reaction heater 17, or may heat the electroless plating solution to a temperature lower or higher than the desired plating temperature.

Figure 6:
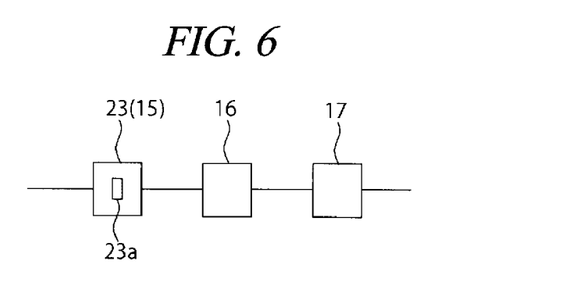
FIG. 6 is a schematic diagram showing another example of the activation unit according to the first exemplary embodiment.

FIG. 6 is a schematic diagram showing another example of the activation unit 15 according to the first exemplary embodiment. In FIG. 6, illustration of the electromagnetic on-off valves (see reference numerals "41*a*", "41*b*" and "41*c*" in FIG. 4) is omitted.

The activation unit 15 shown in FIG. 6 is configured as a catalyst contact unit 23. The catalyst contact unit 23 includes a catalyst member 23*a*, and activates the electroless plating solution with respect to the plating reaction by bringing the catalyst member 23*a* into contact with the electroless plating solution. The catalyst member 23*a* may be brought into contact with the electroless plating solution stored in a container such as a tank, or may be brought into contact with the electroless plating solution flowing in a flow line. Therefore, the catalyst member 23*a* may be provided inside a container, such as a tank, provided at a portion of the plating solution supply passage 12, or may be provided directly inside the plating solution supply passage 12. The activation of the electroless plating solution with respect to the plating reaction progresses as the amount and the time of the electroless plating solution in contact with the catalyst member 23*a* increases. Therefore, in order for the catalyst member 23*a* to efficiently activate the electroless plating solution, it is preferable to increase the surface area of the catalyst member 23*a* that can come into contact with the electroless plating solution. For example, the catalyst member 23*a* may preferably have a mesh shape (reticulation shape).

A material of the catalyst member 23*a* is not limited and may be selected depending on the plating metal (i.e., a metal component dissolved in the electroless plating solution). In general, the material of the catalyst member 23*a* is a metal. For example, when copper (Cu) is precipitated through the plating reaction, palladium (Pd), ruthenium (Ru) and platinum (Pt) may be preferably used as the material of the catalyst member 23*a*.

The electroless plating solution brought into contact with the catalyst member 23*a* in the catalyst contact unit 23 is stored in the reservoir 16 in a state where the activation with respect to the plating reaction has progressed. Then, the electroless plating solution is heated by the reaction heater 17 to the desired plating temperature.

Figure 7:
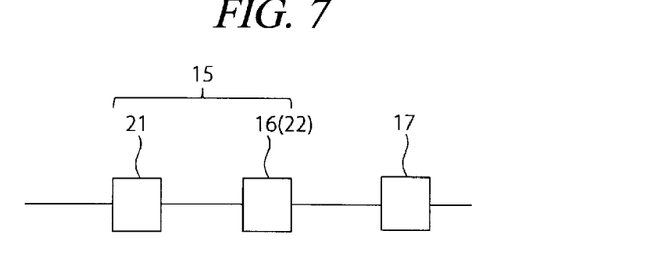
FIG. 7 is a schematic diagram showing a modification example of the activation unit according to the first exemplary embodiment.

FIG. 7 is a schematic diagram showing a modification example of the activation unit 15 according to the first exemplary embodiment. In FIG. 7, illustration of the electromagnetic on-off valves (see reference numerals "41*a*", "41*b*" and "41*c*" in FIG. 4) is omitted.

Like the activation unit 15 shown in FIG. 5, the activation unit 15 shown in FIG. 7 has the activation heater 21 and the temperature lowering unit 22, but in the present example, the reservoir 16 is used as the temperature lowering unit 22. That is, the activation unit 15 is composed of the activation heater 21 provided on an upstream side of the reservoir 16 and the reservoir 16 (i.e., the temperature lowering unit 22).

The reservoir 16 shown in FIG. 7 stores therein the electroless plating solution heated by the activation heater 21, and the temperature of the electroless plating solution is lowered in the reservoir 16. Specifically, the temperature of the electroless plating solution stored in the reservoir 16 may be lowered slowly by leaving and cooling the electroless plating solution in the room temperature environment. Alternatively, the temperature of the electroless plating solution stored in the reservoir 16 may be lowered actively by a chiller (not shown) provided in the reservoir 16.

In the present modification example, the electroless plating solution heated by the activation heater 21 is stored in the reservoir 16 in a state where the activation with respect to the plating reaction has progressed, and then heated by the reaction heater 17 to the desired plating temperature.

Second Exemplary Embodiment

Components identical or similar to those of the first exemplary embodiment will be assigned identical reference numerals, and explanation thereof will be omitted.

Figure 8:
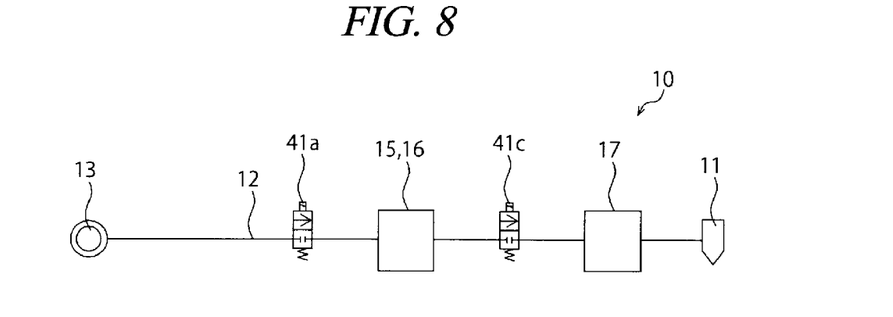
FIG. 8 is a schematic diagram illustrating a structural example of the reaction acceleration unit according to a second exemplary embodiment.

FIG. 8 is a schematic diagram illustrating a structural example of the reaction acceleration unit 10 according to a second exemplary embodiment.

The activation unit 15 of the present exemplary embodiment is provided as one body with the reservoir 16 and activates the electroless plating solution stored in the reservoir 16. The electroless plating solution is stored in the reservoir 16 in a state where the activation with respect to the plating reaction has progressed, and then heated by the reaction heater 17 to the desired plating temperature.

Figure 9:
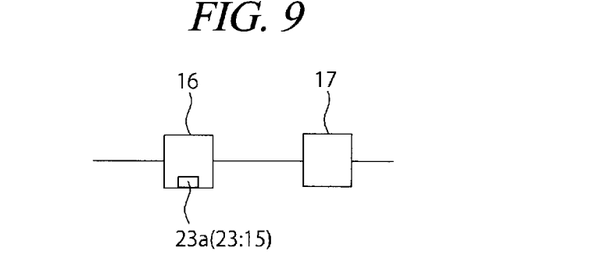
FIG. 9 is a schematic diagram showing an example of the activation unit according to the second exemplary embodiment.

FIG. 9 is a schematic diagram showing an example of the activation unit 15 according to the second exemplary embodiment. In FIG. 9, illustration of the electromagnetic on-off valves (see reference numerals "41a" and "41c" in FIG. 8) is omitted.

The reservoir 16 shown in FIG. 9 is equipped with the catalyst contact unit 23 as the activation unit 15, and the catalyst member 23a is provided inside the reservoir 16 that stores therein the electroless plating solution. The electroless plating solution is activated with respect to the plating reaction by being brought into contact with the catalyst member 23a in the reservoir 16, and stored in the reservoir 16 in a state where the activation has progressed. Then, the electroless plating solution is heated by the reaction heater 17 to the desired plating temperature.

Also, if it is not preferable that the electroless plating solution is in constant contact with the catalyst member 23a in the reservoir 16 from the viewpoint of suppressing the precipitation of the plating metal in the reservoir 16, the catalyst member 23a may be provided to be movable by a moving mechanism (not shown). That is, after the contact with the electroless plating solution stored in the reservoir 16, the catalyst member 23a may be moved to a position where it is not in contact with the electroless plating solution.

Figure 10:
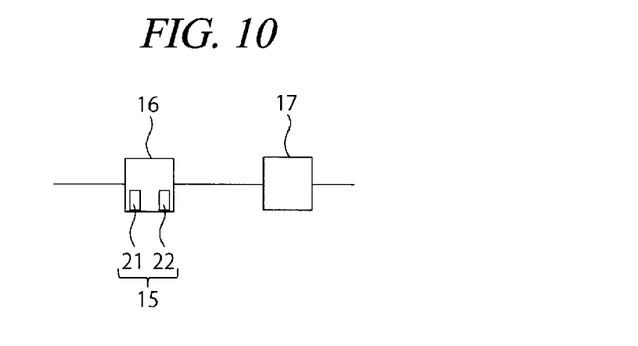
FIG. 10 is a schematic diagram showing another example of the activation unit according to the second exemplary embodiment.

FIG. 10 is a schematic diagram showing another example of the activation unit 15 according to the second exemplary embodiment. In FIG. 10, illustration of the electromagnetic on-off valves (see reference numerals "41a" and "41c" in FIG. 8) is omitted.

The reservoir 16 shown in FIG. 10 is equipped with the activation heater 21 and the temperature lowering unit 22, as the activation unit 15. The electroless plating solution is activated with respect to the plating reaction by being heated by the activation heater 21 in the reservoir 16, and the progress of the activation with respect to the plating reaction is suppressed by cooling the electroless plating solution by the temperature lowering unit 22. The electroless plating solution is stored in the reservoir 16 in a state where the activation has progressed. Then, the electroless plating solution is heated by the reaction heater 17 to the desired plating temperature.

If the progress of the activation of the electroless plating solution is suppressed sufficiently by natural cooling after the electroless plating solution is heated by the activation heater 21, the electroless plating solution does not need to be cooled by the temperature lowering unit 22, and the temperature lowering unit 22 configured to perform active cooling may not be provided. In this case, the reservoir 16 in which the electroless plating solution is cooled naturally serves as the temperature lowering unit 22 that lowers the temperature of the electroless plating solution.

Third Exemplary Embodiment

Components identical or similar to those of the first exemplary embodiment and the second exemplary embodiment will be assigned identical reference numerals, and explanation thereof will be omitted.

Figure 11:
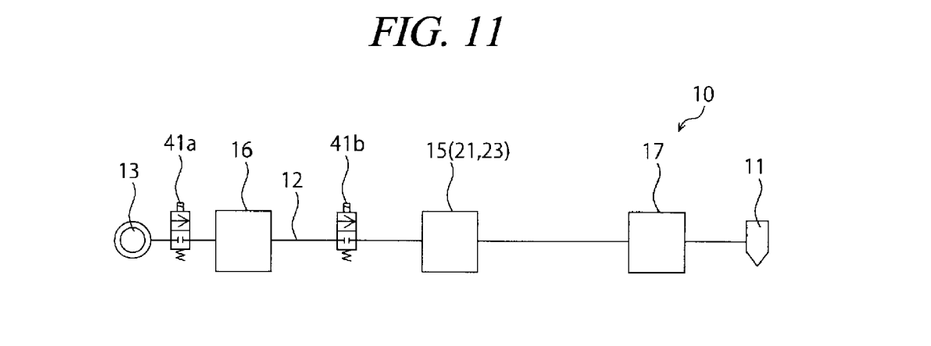
FIG. 11 is a schematic diagram illustrating a structural example of the reaction acceleration unit according to a third exemplary embodiment.

FIG. 11 is a schematic diagram illustrating a structural example of the reaction acceleration unit 10 according to a third exemplary embodiment.

The reservoir 16, the activation unit 15 and the reaction heater 17 are provided sequentially from the upstream side toward the downstream side of the plating solution supply passage 12 according to the present exemplary embodiment. The reservoir 16 is provided via the electromagnetic on-off valve 41a on the downstream side of the plating solution source 13. The activation unit 15 is provided via the electromagnetic on-off valve 41b on the downstream side of the reservoir 16. The reaction heater 17 is provided without any electromagnetic on-off valve on the downstream side of the activation unit 15. The processing liquid supply 11 is provided without any electromagnetic on-off valve on the downstream side of the reaction heater 17.

In the present exemplary embodiment, an unused electroless plating solution sent from the plating solution source 13 is first stored in the reservoir 16. Then, the electroless plating solution sent to the downstream side of the reservoir 16 is activated with respect to the plating reaction by the activation unit 15. Thereafter, the electroless plating solution is sent to the reaction heater 17 without being stopped by the electromagnetic on-off valve or the like. Subsequently, the electroless plating solution is heated by the reaction heater 17 to the desired plating temperature, and then sent to the processing liquid supply 11 without being stopped by the electromagnetic on-off valve or the like. The electroless plating solution is supplied to the substrate W from the processing liquid supply 11.

As such, the electroless plating solution is sent to the reaction heater 17 immediately after it is activated with respect to the plating reaction by the activation unit 15, and then heated by the reaction heater 17. Therefore, as for the activation unit 15, it is preferable to activate the electroless plating solution by the activation heater 21 and/or the catalyst contact unit 23.

Fourth Exemplary Embodiment

Components identical or similar to those of the first exemplary embodiment to the third exemplary embodiment will be assigned identical reference numerals, and explanation thereof will be omitted.

Figure 12:
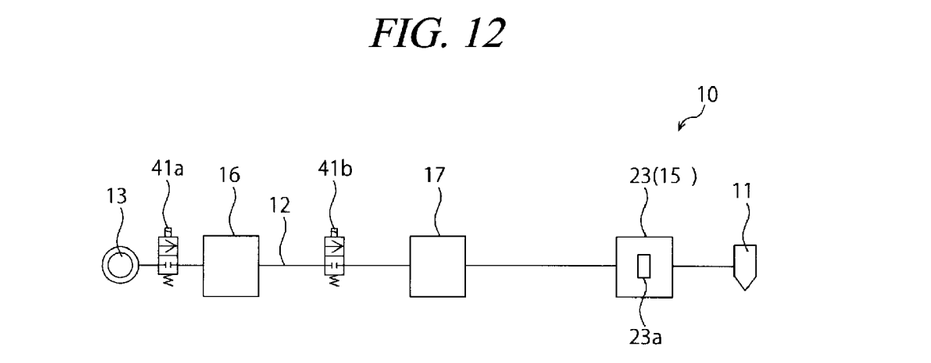
FIG. 12 is a schematic diagram illustrating a structural example of the reaction acceleration unit according to a fourth exemplary embodiment.

FIG. 12 is a schematic diagram illustrating a structural example of the reaction acceleration unit 10 according to a fourth exemplary embodiment.

The reservoir 16, the reaction heater 17 and the catalyst contact unit 23 (the activation unit 15) are provided sequentially from the upstream side toward the downstream side of the plating solution supply passage 12 according to the present exemplary embodiment. The reservoir 16 is provided via the electromagnetic on-off valve 41a on the downstream side of the plating solution source 13. The reaction heater 17 is provided via the electromagnetic on-off valve 41b on the downstream side of the reservoir 16. The catalyst contact unit 23 (the activation unit 15) is provided without any electromagnetic on-off valve on the downstream side of the reaction heater 17. The processing liquid supply 11 is provided without any electromagnetic on-off valve on the downstream side of the catalyst contact unit 23.

In the present exemplary embodiment, an unused electroless plating solution sent from the plating solution source 13 is first stored in the reservoir 16. Then, the electroless plating solution sent to the downstream side of the reservoir 16 is heated by the reaction heater 17 to the desired plating temperature. Thereafter, the electroless plating solution is sent to the catalyst contact unit 23 without being stopped by the electromagnetic on-off valve or the like. The catalyst contact unit 23 (the activation unit 15) activates the electroless plating solution with respect to the plating reaction by bringing the electroless plating solution heated by the reaction heater 17 into contact with the catalyst member 23a.

Subsequently, the electroless plating solution activated with respect to the plating reaction is sent from the catalyst contact unit 23 to the processing liquid supply 11 without being stopped by the electromagnetic on-off valve or the like. The electroless plating solution is supplied to the substrate W from the processing liquid supply 11.

As such, the electroless plating solution may be activated with respect to the plating reaction by the catalyst contact unit 23 (the activation unit 15) after it is heated by the reaction heater 17.

Also, from the viewpoint of suppressing the precipitation of the plating metal in the catalyst contact unit 23, it is preferable to heat the electroless plating solution by the reaction heater 17 to a relatively low plating temperature. That is, it is preferable that the reaction heater 17 heats the electroless plating solution to a temperature at which the plating metal can be precipitated but the inclination of the plating film thickness Y with respect to the time X is relatively gentle (see "third temperature electroless plating solution T3" in FIG. 3). In this case, the electroless plating solution may be discharged from the processing liquid supply 11, and then heated to a higher plating temperature, or the electroless plating solution on the substrate W may be heated to the desired plating temperature by using the cover body 77 (see FIG. 2) equipped with the heater 77a.

Fifth Exemplary Embodiment

Components identical or similar to those of the first exemplary embodiment to the fourth exemplary embodiment will be assigned identical reference numerals, and explanation thereof will be omitted.

Figure 13:
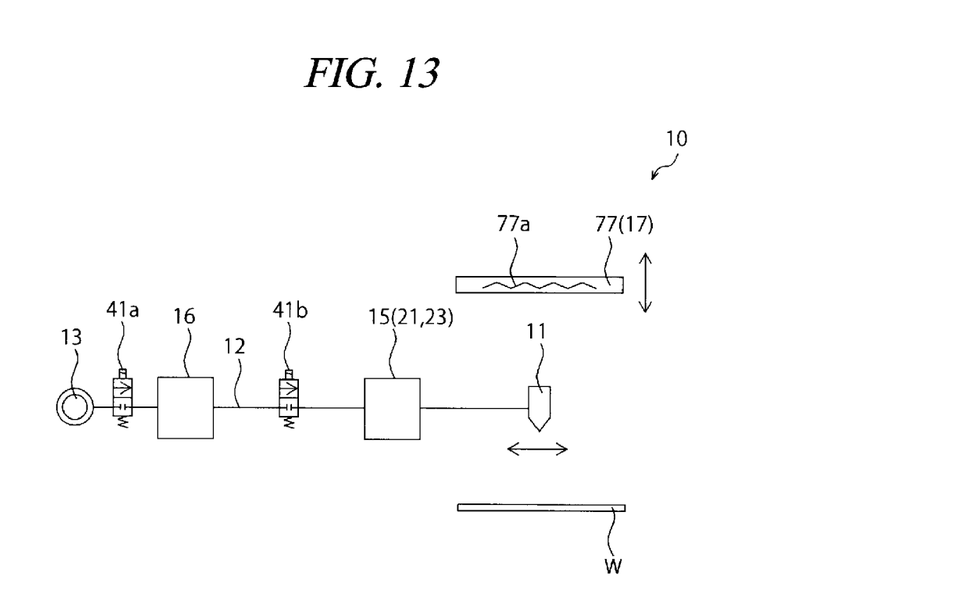
FIG. 13 is a schematic diagram illustrating a structural example of the reaction acceleration unit according to a fifth exemplary embodiment.

FIG. 13 is a schematic diagram illustrating a structural example of the reaction acceleration unit 10 according to a fifth exemplary embodiment.

The reservoir 16 and the activation unit 15 are provided sequentially from the upstream side toward the downstream side of the plating solution supply passage 12 according to the present exemplary embodiment. The reservoir 16 is provided via the electromagnetic on-off valve 41a on the downstream side of the plating solution source 13. The activation unit 15 is provided via the electromagnetic on-off valve 41b on the downstream side of the reservoir 16. The processing liquid supply 11 is provided without any electromagnetic on-off valve on the downstream side of the activation unit 15.

The activation unit 15 may be configured as, but not limited to, the activation heater 21 or the catalyst contact unit 23. Meanwhile, the reaction heater 17 is configured as the cover body 77 equipped with the heater 77a. Therefore, the electroless plating solution is activated by the activation unit 15 before (particularly immediately before) it is discharged from the processing liquid supply 11. After the electroless plating solution is discharged from the processing liquid supply 11, the electroless plating solution on the substrate W is heated to the plating temperature.

In the present exemplary embodiment, an unused electroless plating solution sent from the plating solution source 13 is first stored in the reservoir 16. Then, the electroless plating solution sent to the downstream side of the reservoir 16 is activated with respect to the plating reaction by the activation unit 15. Thereafter, the electroless plating solution is sent to the processing liquid supply 11 without being stopped by the electromagnetic on-off valve or the like. The electroless plating solution is supplied to the substrate W from the processing liquid supply 11. Subsequently, the electroless plating solution on the substrate W is heated by the cover body 77 (the heater 77a) to the plating temperature, and the deposition of the plating metal is accelerated.

As such, the electroless plating solution may be heated by the reaction heater 17 to the plating temperature after it is discharged from the processing liquid supply 11.

Application Example

The above-described technique can be applied throughout the electroless plating. Particularly, the above-described technique is useful when the incubation time tends to increase. Therefore, the above-described technique is particularly useful when a catalyst member (e.g., a seed layer or the like) is not used on the processing surface (particularly, a place where the plating metal is to be deposited) of the substrate W. For example, by using the above-described technique when the plating metal is deposited in a via hole by a damascene method (particularly when the seed layer is not formed on a side surface of the via hole), it is possible to shorten a processing time.

Figure 14:
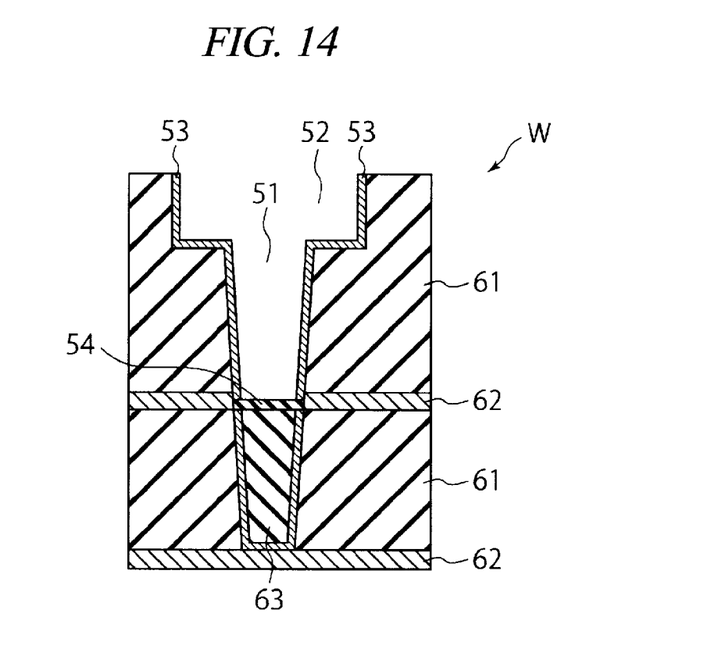
FIG. 14 is a cross-sectional view showing a part of a substrate, and shows an example of the flow of electroless plating.
Figure 15:
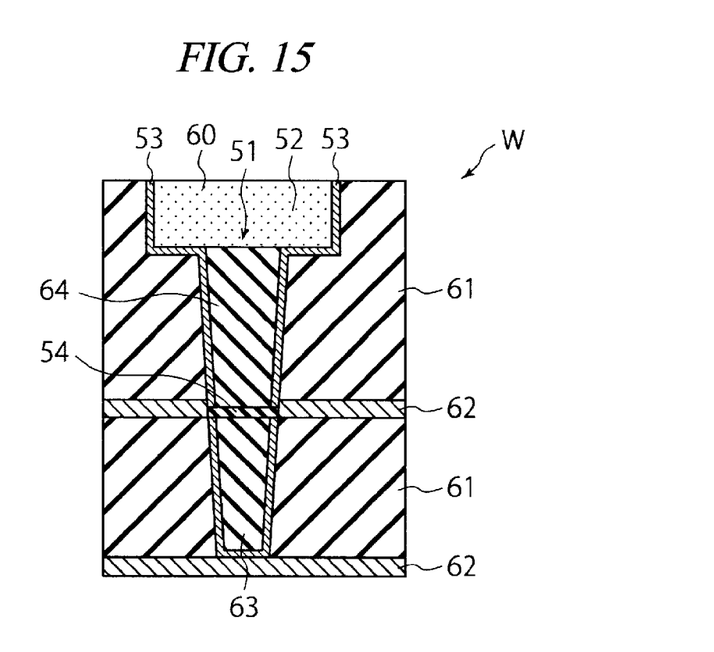
FIG. 15 is a cross-sectional view showing a part of the substrate, and shows an example of the flow of electroless plating.

FIG. 14 and FIG. 15 are cross-sectional view each showing a part (particularly, a part having a via hole 51) of a substrate W, and show examples of the sequence of the electroless plating. The substrate W shown in FIG. 14 and FIG. 15 has the via hole 51 and a trench 52 formed in an insulating film 61, a diffusion barrier layer 53 provided on the insulating film 61 to partition the via hole 51 and the trench 52, and a cap layer 54 exposed at a bottom portion of the via hole 51. The upper insulating film 61 and the lower insulating film 61 are separated by an etching stop layer 62. In an area partitioned by the diffusion barrier layer 53 in the lower insulating film 61, a first metal wiring 63 made of copper is buried. A top surface of the first metal wiring 63 is coated with the cap layer 54. The via hole 51 and the trench 52 are located on the cap layer 54 on the opposite side of the first metal wiring 63. The via hole 51 and the cap layer 54 are provided to penetrate through the etching stop layer 62 between the upper insulating film 61 and the lower insulating film 61.

The diffusion barrier layer 53 provided on the via hole 51 and the trench 52 is configured to suppress the diffusion of the metal wiring into the insulating film 61, and does not contain the catalytic component that causes the plating reaction. Meanwhile, the cap layer 54 is made of a material that serves as a catalyst nucleus for the plating reaction in the electroless plating for burying a metal (via) in the via hole 51. For example, if copper as the plating metal is buried in the via hole 51, the diffusion barrier layer 53 can be made of tantalum, tantalum nitride, titanium or titanium nitride and the cap layer 54 can be made of cobalt.

If the plating metal is buried in the via hole 51 to form a second metal wiring 64, the plating metal precipitates in an electroless plating solution 60 in a state where the via hole 51 is filled with the electroless plating solution 60 discharged from the processing liquid supply 11 (see FIG. 2, etc.). Particularly, the cap layer 54 serves as a nucleus for the plating reaction, but the diffusion barrier layer 53 does not contribute to the plating reaction, and, thus, the plating metal is gradually deposited upwards from the bottom portion of the via hole 51 in a bottom-up manner. If the plating metal is deposited in the bottom-up manner, the incubation time in the electroless plating tends to be increased. Therefore, by using the above-described various devices (FIG. 4 to FIG. 13), it is possible to supply the via hole 51 with the electroless plating solution 60 capable of achieving an appropriate plating film growth rate in plating film growing process while shortening the incubation time.

It should be noted that the above-described exemplary embodiments and modification examples are illustrative in all aspects and is not anyway limiting. The above-described exemplary embodiments and modification examples may be omitted, replaced and modified in various ways without departing from the scope and the spirit of claims. By way of example, the above-described exemplary embodiments and modification examples may be combined with each other, or an exemplary embodiment other than the above-described exemplary embodiments and modification examples may be combined with the above-described exemplary embodiments or modification examples.

Furthermore, a technical category for embodying the above-described technical concept is not particularly limited. By way of example, the above-described substrate liquid processing apparatus may be applied to another apparatus. Moreover, the above-described technical concept may be embodied by a computer-executable program for executing one or more sequences (processes) included in the above-described substrate liquid processing method on a computer. Moreover, the above-described technical concept may be embodied by a computer-readable non-transitory recording medium in which such a computer-executable program is stored.

We claim:

1. A substrate liquid processing apparatus, comprising:
a substrate holder configured to hold a substrate;
a reaction acceleration unit, configured to accelerate a plating reaction of an unused electroless plating solution, including an activation unit configured to accelerate the electroless plating solution with respect to the plating reaction and a reaction heater configured to heat the electroless plating solution; and
a plating solution supply configured to supply the electroless plating solution to the substrate held by the substrate holder,
wherein the activation unit has a catalyst contact unit configured to activate the electroless plating solution with respect to the plating reaction by bringing a catalyst member into contact with the electroless plating solution.

2. The substrate liquid processing apparatus of claim 1, wherein the reaction heater heats the electroless plating solution which has been activated by the activation unit.

3. The substrate liquid processing apparatus of claim 1, wherein the activation unit activates the electroless plating solution, which has been heated by the reaction heater, with respect to the plating reaction.

4. The substrate liquid processing apparatus of claim 1, wherein the plating solution supply supplies the substrate with the electroless plating solution which has been activated by the activation unit.

5. The substrate liquid processing apparatus of claim 1, wherein the activation unit has an activation heater configured to heat the electroless plating solution.

6. The substrate liquid processing apparatus of claim 5, wherein the activation unit has a temperature lowering unit configured to lower a temperature of the electroless plating solution which has been heated by the activation heater.

7. The substrate liquid processing apparatus of claim 1, wherein the catalyst member is in the form of a mesh.

8. The substrate liquid processing apparatus of claim 1, further comprising:
a reservoir configured to store therein the electroless plating solution which has been activated by the activation unit,
wherein the reaction heater heats the electroless plating solution sent from the reservoir.

9. The substrate liquid processing apparatus of claim 8, wherein the activation unit activates the electroless plating solution in the reservoir.

10. The substrate liquid processing apparatus of claim 1, wherein the reaction heater heats the electroless plating solution flowing in a passage connected to the plating solution supply.

11. A substrate liquid processing method for use with the substrate liquid processing apparatus of claim 1, the method comprising:
accelerating the plating reaction of the unused electroless plating solution, the accelerating of the plating reaction including activating the electroless plating solution with respect to the plating reaction and heating the electroless plating solution; and
supplying the electroless plating solution to the substrate,
wherein the activating of the electroless plating solution with respect to the plating reaction brings the catalyst member into contact with the electroless plating solution.

* * * * *